(12) United States Patent
Sailer et al.

(10) Patent No.: US 7,476,484 B2
(45) Date of Patent: Jan. 13, 2009

(54) PHOTOCROSSLINKABLE POLYURETHANES

(75) Inventors: Bernhard Sailer, Basel (CH); Catherine Schoenenberger, Rantzwiller (FR); Ottilie Zelenko, Oberwil (CH)

(73) Assignee: Huntsman Advanced Materials Americas Inc., The Woodlands, TX (US)

( * ) Notice: Subject to any disclaimer, the term of this patent is extended or adjusted under 35 U.S.C. 154(b) by 192 days.

(21) Appl. No.: 10/567,318

(22) PCT Filed: Aug. 4, 2004

(86) PCT No.: PCT/EP2004/051709
§ 371 (c)(1), (2), (4) Date: Feb. 7, 2006

(87) PCT Pub. No.: WO2005/014682
PCT Pub. Date: Feb. 17, 2005

(65) Prior Publication Data
US 2006/0204895 A1    Sep. 14, 2006

(30) Foreign Application Priority Data
Aug. 7, 2003   (CH) .................................... 1363/03

(51) Int. Cl.
G03F 7/00     (2006.01)
G03F 7/004    (2006.01)
(52) U.S. Cl. .............. 430/270.1; 430/281.1; 430/284.1; 430/311; 430/330; 430/331
(58) Field of Classification Search ............. 430/270.1, 430/281.1, 284.1, 311, 330, 331
See application file for complete search history.

(56) References Cited

U.S. PATENT DOCUMENTS

| | | | | |
|---|---|---|---|---|
| 4,666,821 A | * | 5/1987 | Hein et al. | 430/311 |
| 4,877,711 A | | 10/1989 | Aoai et al. | |
| 5,068,262 A | * | 11/1991 | Noguchi | 522/95 |
| 6,177,523 B1 | * | 1/2001 | Reich et al. | 525/459 |
| 6,417,243 B1 | | 7/2002 | Peeters et al. | |

FOREIGN PATENT DOCUMENTS

| | | | |
|---|---|---|---|
| EP | 0 480 251 | | 4/1992 |
| JP | 2002338652 A | * | 11/2002 |
| JP | 2003 268067 A | | 9/2003 |
| WO | WO 02/094904 | | 11/2002 |

OTHER PUBLICATIONS

English language machine abstract of JP 2002-338652.*

* cited by examiner

Primary Examiner—Amanda C. Walke

(57) ABSTRACT

Linear crosslinkable polyurethanes obtained from (a) at least one diisocyanate having 2 to 30 carbon atoms, (b) at least one aliphatic or cycloaliphatic diol having 2 to 30 carbon atoms, to whose carbon chain at least one carboxyl group is covalently bonded, and some or all of said carboxyl groups have been esterified with an olefinically unsaturated $C_3$-$C_8$ alcohol or with the glycidyl ester of an olefinically unsaturated $C_3$-$C_8$ carboxylic acid, and (c) optionally at least one aliphatic or cycloaliphatic diol having 2 to 30 carbon atoms, to whose carbon chain at least one carboxyl group is covalently bonded. The polyurethanes are suitable, alone or as a mixture with other reactive components, for thermal and/or photochemical crosslinking in crosslinkable compositions for the production of mouldings, coatings and in particular solder masks.

13 Claims, No Drawings

PHOTOCROSSLINKABLE POLYURETHANES

CROSS REFERENCE TO RELATED APPLICATIONS

This application is the National Phase of International Application PCT/EP2004/051709 filed Aug. 4, 2004 which designated the U.S. and which claims priority to Swiss (CH) Pat. App. No. 01363/03 filed Aug. 7, 2003. The noted applications are incorporated herein by reference.

The present invention relates to linear polyurethanes having repeating structural units of diols which contain at least one carboxyl group, having repeating structural elements of diisocyanates and optionally having repeating structural elements of diols; block copolymers of these polyurethanes which are OH— or NCO-terminated, with NCO— or OH-terminated polymers; those polyurethanes in which some or all of the carboxyl groups have been esterified with ethylenically unsaturated alcohol or epoxide; photocurable and optionally additionally thermally curable compositions which contain these polyurethanes; materials coated with the cured and optionally structured composition; and a process for the production of optionally structured coatings on surfaces of solid materials using the compositions. U.S. Pat. No. 4,794,133 describes acrylate-terminated polyurethanes polymerizable (curable) with UV radiation and obtained from diisocyanates and diols, for coating optical fibres.

EP-0 414 102 A2 describes modified isophorone diisocyanates, one of whose isocyanate groups contains a dihydroxyethylamino group as a diol component and the other of whose isocyanate groups contains an ethylenically unsaturated group covalently bonded via a bridge group. These monomers are used for the preparation of polyurethane elastomers, with which, inter alia, surfaces can be coated and then polymerized under the action of radiation.

WO 01/25306 describes radiation-polymerizable, linear polyurethanes obtained from aliphatic diisocyanates, aliphatic diols and monofunctional olefinically unsaturated compounds, which polyurethanes have terminal olefinic groups and are used as powder coating materials.

Radiation-polymerizable (curable), linear polyurethanes containing ethylenically unsaturated groups have already been proposed for the coating of surfaces, cf. EP-0 048 913 A1. The polyurethanes are prepared from diols, diisocyanates and a reaction product of bisphenols or alkylenedicarboxylic acids and glycidyl(meth)acrylates. The polymers contain no carboxyl groups and therefore cannot be developed with aqueous basic systems to give a structured surface after polymerization under a photomask. In order to avoid this disadvantage, the copolymers are formulated to give coating compositions which contain a copolymer with covalently bonded carboxyl groups. Reaction products are used for the preparation, which is complicated in terms of process engineering and often leads to nonreproducible results.

Radiation-polymerizable coating compositions comprising radiation-sensitive polyurethanes are described in EP0 480 251 A1. The polyurethanes are prepared from diols, diisocyanates and a reaction product of (meth)acrylic acid and polyols or bisepoxides, such as, for example, diglycidyl ethers of bisphenols, and are dispersed together with other ethylenically unsaturated prepolymers in water. These coating compositions are applied over the whole surface and cannot be developed with aqueous basic systems to give a structured surface.

WO 02/09404 describes linear polyurethanes which consist of a reaction product of a bisepoxide with an olefinically unsaturatured carboxylic acid as a diol component, a carboxylic acid having two hydroxyl groups as a further diol component and optionally other diols. They are used for coating and optionally structuring surfaces and they can be developed with aqueous alkaline media. A disadvantage of these systems is the prior preparation of the unsaturated diol component.

Polyurethanes which are polymerizable both under the action of actinic radiation and thermally and in which the radiation-sensitive or thermally polymerizable, olefinic groups are introduced into side chains after the polymerization of the polyurethane components, which have high radiation sensitivity for rapid polymerization or, in the presence of free radical initiators, also thermal sensitivity and additionally are soluble in aqueous alkaline media are not known. Furthermore, block copolymers having such polyurethane blocks are not known. Such a synthesis strategy and such block copolymers are, however, extremely desirable since, after their preparation, polyurethanes can be adjusted specifically with regard to acidity and content of olefinic groups and adapted to the respective requirements of the applications. In addition, a functional or easily functionalized building block for a modular system with other functional polymers is obtained, by means of which building block the properties thereof can be adapted in a variety of ways to processing and desired mechanical and physical properties of the end products.

The invention firstly relates to a process for the production of solder masks on a printed circuit in accordance with the present invention.

The invention firstly relates to linear polyurethanes comprising a) at least one diisocyanate having 2 to 30 carbon atoms and b) at least one aliphatic or cycloaliphatic diol having 2 to 30 carbon atoms, to whose carbon chain at least one carboxyl group is covalently bonded.

The diisocyanates may be aliphatic, cycloaliphatic, aliphatic-cycloaliphatic, araliphatic or aromatic diisocyanates which preferably contain 2 to 20 and particularly preferably 2 to 16 carbon atoms. The isocyanates may be unsubstituted or, for example, substituted by $C_1$-$C_4$alkyl or $C_1$-$C_4$alkoxy, such as methyl, ethyl, methoxy and ethoxy.

The radicals of the diisocyanates of component a) may correspond, for example, to the formula I

$$\text{—(O)CN—R}_1\text{—NC(O)—} \qquad \text{(I)}$$

in which $R_1$ is linear or branched $C_2$-$C_{20}$alkylene, preferably $C_2$-$C_{16}$alkylene and particularly preferably $C_2$-$C_{12}$alkylene; $C_3$-$C_{12}$cycloalkylene, preferably $C_4$-$C_8$cycloalkylene and particularly preferably $C_5$-$C_6$cycloalkylene; $C_2$-$C_4$alkylene-$C_3$-$C_{12}$cycloalkylene and preferably $C_2$-$C_4$alkylene-$C_5$-$C_6$cycloalkylene; $C_2$-$C_4$alkylene-$C_3$-$C_{12}$cycloalkylene-$C_2$-$C_4$alkylene and preferably $C_2$-$C_4$alkylene-$C_5$-$C_6$cycloalkylene-$C_2$-$C_4$alkylene; bis-$C_4$-$C_8$cycloalkylene and preferably bis-$C_5$-$C_6$cycloalkylene, $C_8$-$C_{14}$arylene, preferably $C_8$-$C_{10}$arylene; —$C_6H_4$—$X_1$—$C_6H_4$—; $C_2$-$C_4$alkylene-$C_8H_4$— or $C_2$-$C_4$alkylene-$C_6H_4$—$C_2$-$C_4$alkylene-; and $X_1$ is a direct bond, $C_1$-$C_4$alkylene, $C_2$-$C_6$alkylidene, —O—, —S—, —C(O)—, —$CO_2$—, —S(O)— or —$SO_2$—.

Diisocyanates are widely known in polyurethane chemistry. Some preferred examples are di-, tri-, tetra-, penta-, hexa-, hepta-, octa-, nona-, deca-, undeca- and dodecamethylene diisocyanate, 1,3-propylene or 1,3-butylene diisocyanate, 2,2-dimethyl-1,3-propylene diisocyanate, 2,3-dimethyl-1, 4butylene diisocyanate, 2,5-dimethyl-1,6-hexylene diisocyanate, 1,2- or 1,3-cyclobutylene or -cyclopentylene diisocyanate, mono-, di- or trimethyl-1,2- or 1,3-cyclobutylene or -cyclopentylene diisocyanate, 1,2-, 1,3- or 1,4-cyclohexylene diisocyanate, mono-, di- or trimethyl-1,2-, 1,3- or 1,4-cyclohexylene diisocyanate, 1,3- or 1,4-cyclooctylene diisocyanate, 1-isocyanatomethyl-3-isocyanatocyclohexane, 1-isocyanatomethyl-3-isocyanato-2-methylcyclohexane, 1-isocyanatomethyl-3-isocyanato-1,3-dimethylcyclohexane, 1-isocyanatomethyl-3-isocyanato-1,3,3-trimethylcyclohexane (isophorone diisocyanate), 1,3- or 1,4-diisocyanatomethylcyclohexane, 4,4'-diisocyanatobiscyclohexane, bis(4-isocyanatocyclohexyl)methane or -ethane, 2,3- or 2,4-diisocyanatobenzene, 2,4- or 2,6-dioscyanatotoluene, 2,5- or 2,6-diisocyanatoxylene, 2,7-diisocyanatonaphthalene, 1-isocyanatomethyl-3- or -4-cyanatobenzene, 2-isocyanatomethyl4- or -6-cyanatotoluene, 1,3- or 1,4-diisocyanatomethylbenzene, 4,4'-diisocyanatobiphenyl, 4,4'-diisocyanatobiphenyl ether, 4,4'-diisocyanatobiphenyl thioether, 4,4'-diisocyanatobiphenyl sulphone and bis(4-isocyanatophenyl)methane or -ethane.

The diols of component b) contain preferably 2 to 20 and particularly preferably 2 to 18 carbon atoms and preferably one or two carboxyl groups. The diols preferably contain primary or secondary hydroxyl groups. The aliphatic radical may be linear or branched $C_2$-$C_{18}$alktriyl or $C_2$-$C_{18}$alktetryl. The cycloaliphatic radical may be $C_3$-$C_{12}$—, preferably $C_4$-$C_8$— and particularly preferably $C_5$-$C_6$cycloalktriyl or -cycloalktetryl, monoalkylene-$C_3$-$C_{12}$—, preferably $C_4$-$C_8$— and particularly preferably $C_5$-$C_6$cycloalkdiyl or -cycloalkyltriyl, or bisalkylene-$C_3$-$C_{12}$—, preferably —$C_4$-$C_8$— and particularly preferably —$C_5$-$C_6$cycloalkyl or -cycloalkdiyl.

The radicals of diols containing carboxyl groups may preferably correspond, for example, to the formula I

$$-O-R_2(COOH)_m-O-\qquad(II)$$

in which m is the number 1 or 2 and $R_2$ is a trivalent or tetravalent, aliphatic or cycloaliphatic radical having 2 to 18 and preferably 2 to 12 carbon atoms.

The tri- and tetravalent aliphatic radicals may be derived from linear or branched alkanes, for example ethane and the isomers of propane, butane, pentane, hexane, heptane, octane, nonane, decane, undecane, dodecane, tridecane, tetradecane, pentadecane, hexadecane, heptadecane, octadecane, nonadecane and eicosane.

The tri- and tetravalent cycloaliphatic radicals may be derived from cydoalkanes, for example cyclopropane, cyclobutane, cyclohexane, cycloheptane, cyclooctane, cyclodecane and cyclododecane. One or two $C_1$-$C_4$alkylene, in particular methylene or ethylene, may be bonded to the rings.

The diols substituted by carboxyl groups are known, are commercially available or can be prepared by known and analogous processes, for example epoxidation of olefinically unsaturated mono- or dicarboxylic acids with subsequent alkaline or acidic hydrolysis of the epoxide group. Some examples of dihydroxycarboxylic acids are 1,2-dihydroxypropionic acid, 1,3-dihydroxy-2-carboxypropane, 1,2- or 1,3-dihydroxybutyric acid, 1,4-dihydroxy-2-carboxybutane, 1,3-dihydroxy-2-methyl-2-carboxypropane, 1,5-dihydroxy-3-carboxypentane, 1,6-dihydroxy-3-carboxyhexane, 1,2-dihydroxy-8-carboxyoctane, 1,2- or 2,3-dihydroxy-10-carboxydecane, 1,2- or 3,4-dihydroxy-12-carboxydodecane, 1,2- or 1,3-dihydroxy-14-carboxytetradecane, 1,2- or 2,3- or 3,4-dihydroxy-16-carboxyhexadecane, 1,2- or 2,3- or 3,4-dihydroxy-17-carboxylheptadecane, 1,2- or 2,3- or 3,4-dihydroxy-18-carboxyoctane, 1,3-dihydroxy-2-carboxymethylpropane, 1,4-dihydroxy-2-carboxymethylbutane, 1,5-dihydroxy-3-carboxymethylpentane, tartaric acid, 1,3-dicarboxy-2,3-dihydroxypropane, 1,4-dicarboxy-2,3-dihydroxybutane, 1,4-dihydroxy-2,3-dicarboxybutane, 1,4-dihydroxy-2-carboxycyclohexane and 1,4-dihydroxymethyl-2-carboxycyclohexane.

Preferred diols containing carboxyl groups are 1,2-dihydroxypropionic acid, 1,3-dihydroxy-2-carboxypropane, 1,2- or 1,3-dihdyroxybutyric acid, 1,4-dihydroxy-2-carboxybutane, 1,3-dihydroxy-2-methyl-2-carboxypropane, 1,5-dihydroxy-3-carboxypentane, 1,6-dihydroxy-3-carboxyhexane and tartaric acid. 1,3-Dihydroxy-2-methyl-2-carboxypropane and tartaric acid are particularly preferred.

The polyurethanes according to the invention may additionally contain c) radicals of at least one aliphatic, cycloaliphatic or cycloaliphatic-aliphatic diol, or at least one oligomeric or polymeric oxaalkylene glycol, one polyesterdiol, polycarbonatediol or polylactonediol, or of a diol based on polybutadiene or polyisoprene having terminal hydroxyl groups.

The aliphatic diols may be linear or branched and contain preferably 2 to 18, more preferably 2 to 12 and particularly preferably 2 to 6 carbon atoms. Examples of aliphatic radicals (alkylene) have been given above for $R_1$. Some examples of preferred aliphatic diols are ethylene, 1,2- and 1,3-propylene, 1,2-, 1,3- and 1,4-butylene, 1,2-, 1,3-, 1,4- and 1,5-pentylene and 1,2, 1,3-, 1,4-, 1,5- and 1,6-hexylene glycol, heptanediols, octanediols, decanediols, tetradecanediols, hexadecanediols and octadecanediols. $C_2$-$C_6$Alkylenediols are particularly preferred.

The cycloaliphatic or cycloaliphatic-aliphatic radicals may be mononuclear rings or polynuclear linked, bridged or fused ring systems, the rings containing 3 to 12, preferably 4 to 8 and particularly preferably 5 or 6 ring carbon atoms. Examples of the latter are [2.2.1]bicycloheptane, [2.2.2]bicyclooctane and [1.0.0]tricyclodecane. Cyclic radicals are preferably substituted by two $C_2$-$C_4$hydroxyalkyl and particularly preferably by two hydroxymethyl. Examples of cycloaliphatic and cycloaliphatic-aliphatic radicals have been mentioned above for $R_1$. Some preferred examples of cycloaliphatic or cycloaliphatic aliphatic diols are 1,3-dihydroxycyclopentane, 1,3- and 1,4-dihydroxycyclohexane, 1,4-dihydroxymethylcyclohexane, 4,4'-dihydroxy- or -dihydroxymethyl-1,1'-bicyclohexane, 1,4-dihydroxymethyl [2.2.1]bicycloheptane or 1,4-dihydroxymethyl[2.2.2] bicyclooctane.

Oligomeric or polymeric oxaalkylene glycols are preferably derived from $C_2$-$C_6$alkylenediols, which may be linear or branched and may consist of identical or different alkylenediols. Preferred examples of alkylenediols are ethylene glycol, 1,2- or 1,3-propylene glycol and 1,4-butylene glycol. Some examples are di-, tri- and tetraethylene glycol, di-, tri- and tetrapropylene glycol, oligomeric ethylene glycols, propylene glycols or mixed ethylene-propylene glycols having up to 50 oxaethylene or oxapropylene units, polymeric ethylene glycols, propylene glycols or mixed ethylene-propylene glycols having up to 500, preferably up to 300, oxaethylene or oxapropylene units, and polytetrahydrofuran (polybutylene glycol).

The polyesterdiols are polyesters obtained from aliphatic, cycloaliphatic or aromatic dicarboxylic acids and aliphatic $C_2$-$C_{12}$alkylenediols, preferably $C_2$-$C_6$alkylenediols, oligomeric or polymeric oxaalkylene glycols, or mixtures of said diols, whose terminal carboxyl groups have been esterified with a diol.

The polycarbonatediols are polymers obtained from aliphatic $C_2$-$C_{12}$alkylenediols, preferably $C_2$-$C_6$alkylenediols, oligomeric or polymeric oxaalkylene glycols, or mixtures of said diols and phosgene or dialkyl carbonates (for example dimethyl or diethyl carbonates).

The polylactonediols are polylactones, for example polyvalerolactone, whose terminal carboxyl groups have been esterified with a diol.

Diols based on polybutadiene or polyisoprene may contain primary or secondary terminal hydroxyl groups. The polybutadienes or polyisoprenes may be homopolymers or copolymers with ethylenically unsaturated comonomers. Suitable comonomers are, for example, olefins (ethene, propene, butene, pentene, hexene, octene), vinyl ethers, vinyl esters, styrene, acrylonitrile, acrylic acid, methacrylic acid, acrylates and acrylamides and methacrylates and methacrylamides. Diols based on only polybutadiene are preferred.

Oligomeric or polymeric oxaalkylene glycols, polyesterdiols, polycarbonatediols, polylactonediols and polybutadienediols or polyisoprenediols are known, can be prepared by analogous processes and are commercially available. The oligomeric or polymeric diols may have an average molecular weight Mw of 400 to 20 000 g/mol and preferably 800 to 10 000 g/mol, measured by gel permeation chromatography (GPC) using toluene as a standard. In particular, the flexibility in the polyurethanes according to the invention can be advantageously influenced with oligomeric or polymeric diols.

In a preferred embodiment, the diol radicals correspond to the formula III

$$\mathrm{-O-R_3-O-} \qquad (III)$$

in which $R_3$ is linear or branched $C_2$-$C_{18}$alkylene, preferably $C_2$-$C_{12}$alkylene and particularly preferably $C_2$-$C_6$alkylene; $C_3$-$C_{12}$cycloalkylene, preferably $C_4$-$C_8$cycloalkylene and particularly preferably $C_5$-$C_8$cycloalkylene; $C_2C_4$alkylene-$C_3$-$C_{12}$cycloalkylene and preferably $C_2$-$C_4$alkylene-$C_5$-$C_6$cycloalkylene; $C_2$-$C_4$alkylene-$C_3$-$C_{12}$cycloalkylene-$C_2$-$C_4$alkylene and preferably $C_2$-$C_4$alkylene-$C_5$-$C_6$cycloalkylene-$C_2$-$C_4$alkylene; bis-$C_4$-$C_8$cycloalkylene and preferably bis-$C_5$-$C_6$cycloalkylene.

The radicals of oligomeric or polymeric oxaalkylene glycols are preferably derived from linear or branched $C_2$-$C_6$alkylenediols, particularly preferably $C_2$-$C_4$alkylenediols. The oligomeric and polymeric oxaalkylene glycols may contain 2 to 1 000, preferably 2 to 600 and particularly preferably 2 to 400 identical or different oxaalkylene units.

In a preferred embodiment, the oxaalkylene radicals correspond to the formula IV $$\mathrm{-O-(R_4-O)_n-} \qquad (IV)$$

in which $R_4$ is identical or different $-C_rH_{2r}-$, r is a number from 2 to 6 and is preferably 2 to 4, and n has an average numerical value from 2 to 600. $R_4$ is preferably ethylene, 1,2- or 1,3-propylene, 1,2-, 1,3- or 1,4-butylene. Some examples of oxaalkylene glycols from which radicals of the formula IV may be derived are diethylene glycol, triethylene glycol, ethylene 1,2-propylene glycol, polyoxaethylene glycol having 3 to 600 oxaethylene units, polyoxa-1,2-propylene glycol having 3 to 600 oxapropylene units, mixed polyoxaethylene glycol/polyoxa-1,2-propylene glycols as random oligomers and polymers or as block oligomers and block polymers having 3 to 600 oxaalkylene units, poly-1,3-oxapropylene and poly-1,4-oxabutylene (polytetrahydrofuran).

Polyesterdiols are known for polyurethane chemistry. They may be hydroxyalkyl-terminated polymers of hydroxycarboxylic acids or aliphatic, cycloaliphatic or aromatic dicarboxylic acids and diols. Examples of hydroxycarboxylic acids are $\omega$-$C_2$-$C_6$alkylcarboxylic acids. Examples of dicarboxylic acids are 1,4-cyclohexanedicarboxylic acid, terephthalic acid and isophthalic acid. Examples of diols are linear $C_2$-$C_6$alkylenediols. The termination is preferably carried out with $C_2$-$C_6$alkylenediols.

Diols based on polybutadiene preferably correspond to the formula V

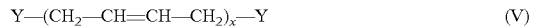

$$\mathrm{Y-(CH_2-CH=CH-CH_2)_x-Y} \qquad (V)$$

in which x is a number from 6 to 250, preferably 10 to 200 and particularly preferably 20 to 150, and Y is $-CH_2-CH_2-OH$ or $-CH_2-CH(CH_3)-OH$. Such diols are commercially available (for example as KRASOL®) or can be prepared by hydroxylation processes known per se for polybutadiene. The content of diol radicals in these polybutadiene diols surprisingly results in high thermal shock resistance in the polyurethanes according to the invention.

In a preferred embodiment of the invention, the polyurethanes contain repeating units of the formulae I, II, III, IV and/or V

$$\mathrm{-(O)CN-R_1-NC(O)-} \qquad (I),$$

$$\mathrm{-O-R_2(COOH)_m-O-} \qquad (II),$$

$$\mathrm{-O-R_3-O-} \qquad (III),$$

$$\mathrm{-O-(R_4-O)_n-} \qquad (IV),$$

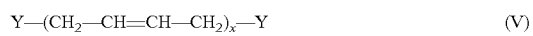

$$\mathrm{Y-(CH_2-CH=CH-CH_2)_x-Y} \qquad (V)$$

or radicals of a polyesterdiol, in which $R_1$, $R_2$, $R_3$, $R_4$, m, n, x and Y have the abovementioned meanings, including the preferences.

The amount of the structural elements of the formula I in the preferred polyurethanes may be 50 mol %, based on 1 mol of the polyurethane. The amount of the structural elements of the formula II may be, for example, 50 to 0.01 mol %, preferably 50 to 2 mol %, particularly preferably 50 to 20 mol % and very particularly preferably 50 to 30 mol %. The amount of the structural elements of the formulae III, IV, V and/or of polyesterdiols may be, for example, 0 to 49.99 mol %, preferably 0 to 48 mol %, particularly preferably 0 to 30 mol % and very particularly preferably 0 to 20 mol %. The molar percentages sum to 100 mol %. In the polyurethanes according to the invention, structural elements of the formula III may have been combined with oligomeric or polymeric diol radicals, in particular with structural elements of the formulae IV, V and radicals of polyesterdiols, so that, for example, in addition to structural elements of the formula II, 10 to 20 mol % of structural elements of the formula III and 0.01 to 10 mol % of structural elements of the formulae IV, V and radicals of polyesterdiols are contained.

The molecular weight (weight average Mw) may be, for example, from 2 000 to 150 000, preferably from 8 000 to 60 000, g/mol, measured by GPC using toluene as a standard.

The polyurethanes according to the invention may be random polymers or block polymers having blocks comprising structural elements of the formulae I and II and blocks comprising structural elements of the formulae I and III, of the formulae I and IV, of the formulae I and V, of the formula I and polyesterdiol radicals, or of the formulae I, III and IV or I, III and V and of the formulae I, III and polyesterdiol radicals.

The polyurethanes according to the invention may additionally be modified in a procedure in which isocyanate-terminated or correspondingly blocked (for example with hydroxymethyl acrylate) isocyanate-terminated polyurethanes are reacted subsequently with mono- or bishydroxyl-modified polymers. For such reactions, for example, the abovementioned polyoxaalkylene glycols and polyesterdiols are suitable. Other suitable polymers are, for example, poly (meth)acrylates whose terminal carboxyl groups have been modified with mercaptoethanol. In these polyurethanes according to the invention, the modifying polymer chains are bonded in the terminal position. Further suitable polymers are, for example, poly(meth)acrylates whose terminal carboxyl groups have been provided with thioglycerol with a diol function. In these polyurethanes, the modifying polymer chains are bonded in such a way that they link the polyurethane blocks to one another and form comb-like structures. Furthermore, hydroxyl-terminated polyurethanes according to the invention can be subsequently modified with isocyanate-terminated or correspondingly blocked (for example with hydroxymethyl acrylate) isocyanate-terminated polyurethanes, with the result that block polyurethanes are obtained. Polyurethanes which can be used for this purpose are known or can be prepared by an analogous method, for example from diisocyanates and diols, as mentioned above, including the preferences. The polyurethanes differ from the polyurethanes according to the invention since they contain no diols having covalently bonded carboxyl groups. With such block copolymers, desired physical and mechanical properties can additionally be established in a controlled manner and adapted to specific applications.

The invention therefore also comprises polyurethanes in the form of block copolymers having blocks of repeating structural elements of the formulae I and II and optionally III, IV, V and/or polyesterdiol radicals, and identical or different blocks of polyoxaalkylenediols, polyesterdiols, polyurethanes without pendant carboxyl groups, and poly(meth) acrylic acid.

According to the invention, salts of the polyurethanes are also included, for example alkaline earth metal (magnesium and calcium) and preferably alkali metal salts (sodium or potassium) and ammonium salts of ammonia or primary, secondary or tertiary $C_1$-$C_{12}$amines, for example methylamine, ethylamine, n-propylamine, n-butylamine, dimethylamine, diethylamine, di-n-propylamine, di-n-butylamine, triethylamine, tri-n-propylamine, tri-n-butylamine, piperidine and morpholine.

The preparation of the linear polyurethanes can be effected by processes known per se, which have been widely described for the polyurethanes in the relevant literature. Frequently, a procedure is adopted in which diols are initially taken in a suitable solvent, a catalyst (organic tin compounds, such as, for example, dibutyltin dilaurate) is added, the mixture is heated and then the isocyanate is slowly added over a relatively long period. The polyurethane obtained can be isolated or the reaction mixture can be used directly for the esterification of the carboxyl groups. Further details are given in the examples.

The polyurethanes according to the invention are outstandingly suitable for further modification with partial or complete esterification of the free carboxyl groups in the structural elements of the formula II, in order to provide photocrosslinkable polymers which, in the case of partial esterification or in combination with polymeric structural elements of polymers containing carboxyl groups, are moreover water-soluble. A particular advantage here is that the acidity (number of carboxyl groups) and the crosslinkability (number of olefinically unsaturated groups or degree of esterification) can be adjusted in one process step. For example, olefinically unsaturated alcohols or glycidylvinyl compounds can be used for the esterification.

The glycidylvinyl compounds used according to the invention each have an epoxide radical and a vinyl radical, an acrylate radical being preferred as the vinyl radical. Examples of such glycidylvinyl compounds are also to be found, inter alia, in U.S. Pat. No. 4,927,884, column 12, line 19 et seq. Organic radicals substituted by a vinyl group are, for example, aliphatic, alicyclic or aromatic radicals substituted by a vinyl group. The aliphatic, alicyclic or aromatic radicals may be optionally substituted alkylene, such as $C_1$-$C_8$alkylene, optionally substituted cycloalkylene, such as $C_5$-$C_8$cycloalkylene, optionally substituted arylene, such as phenylene or naphthylene, or optionally substituted alkenylene, such as $C_2$-$C_8$alkenylene. Suitable substituents for the aliphatic, alicyclic or aromatic radicals are, for example, hydroxyl groups, $C_1$-$C_8$alkyl groups and $C_1$-$C_8$alkoxy groups. The aliphatic, alicyclic or aromatic radicals are preferably unsubstituted.

Compounds suitable for the esterification are in particular low molecular weight, olefinically unsaturated alcohols and glycidyl esters of low molecular weight olefinically unsaturated carboxylic acids. In the context of the invention, low molecular weight may mean alcohols and carboxylic acids having 3 to 8 and preferably 3 to 6 carbon atoms. Some preferred examples are allyl alcohol, crotonyl alcohol, acrylic acid, methacrylic acid and crotonic acid. Glycidyl (meth) acrylate is particularly preferred.

The invention furthermore relates to linear, crosslinkable polyurethanes comprising
a) at least one diisocyanate having 2 to 30 carbon atoms and
b) at least one aliphatic or cycloaliphatic diol having 2 to 30 carbon atoms, to whose carbon chain at least one carboxyl group is covalently bonded, and some or all of said carboxyl groups have been esterified with an olefinically unsaturated $C_3$-$C_8$alcohol or with the glycidyl ester of an olefinically unsaturated $C_3$-$C_8$carboxylic acid, and
c) optionally at least one aliphatic or cycloaliphatic diol having 2 to 30 carbon atoms, to whose carbon chain at least one carboxyl group is covalently bonded.

The linear, crosslinkable polyurethanes according to the invention may additionally contain
d) radicals of at least one aliphatic, cycloaliphatic or cycloaliphatic-aliphatic diol, of at least one oligomeric or polymeric oxaalkylene glycol, of a polyesterdiol, polycarbonatediol or polylactonediol.

The linear, crosslinkable polyurethanes according to the invention may additionally comprise block copolymers as described above.

The degree of esterification may be, for example, 0.1 to 100, preferably 1 to 90 and particularly preferably from 5 to 80, % of the carboxyl groups. The degree of esterification can be determined via the acid number. The acid number may be, for example, 0.2 to 1.4 and preferably 0.6 to 1.4 mol KOH per kg polyurethane (solid), measured by titration with KOH.

Otherwise, the developments, embodiments and preferences as have been indicated above for the linear and uncrosslinkable polyurethanes are applicable.

In a preferred embodiment, the linear, crosslinkable polyurethanes contain repeating units of the formulae I and VI, and optionally II, III, IV, V and/or polyesterdiol radicals,

$$—O—R_3—O— \quad (III),$$

$$—O—(R_4—O)_n— \quad (IV),$$

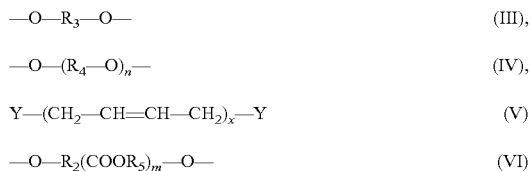

$$—O—R_2(COOR_5)_m—O— \quad (VI)$$

in which $R_1$, $R_2$, $R_3$, $R_4$, Y, m, n and x have the abovementioned meanings, including the preferences, and $R_5$ is allyl, crotonyl, $CH_2=CH_2—C(O)—O—CH_2—CH(OH)—CH_2—$ or $CH_2=C(CH_3)—C(O)—O—CH_2—CH(OH)—CH_2—$.

The crosslinkable polyurethanes can be obtained by esterifying the linear polyurethanes. In order to avoid secondary reactions, inhibitors may be added to the reaction mixture. The reaction temperature is preferably in the range from 70 to 150° C. In the esterification, it is also possible to use alkali metal alcoholates. Expediently, resulting water of reaction is removed during the reaction. Glycidyl esters are as a rule more reactive and are therefore preferably used. Further details are to be found in the examples.

Depending on molecular weight, the crosslinkable polyurethanes according to the invention are liquid to solid material which are soluble in organic solvents and water and can be crosslinked both under the action of either heat or radiation, or heat and radiation. The polyurethanes can therefore also be used in different areas, for which purpose they can be formulated according to the desired applications.

The invention furthermore relates to a composition comprising
a) crosslinkable polyurethane according to the invention,
b) an initiator for the thermal crosslinking of the olefinic groups, or
c) a photoinitiator, or
d) an initiator for the thermal crosslinking of the olefinic groups and a photoinitiator, and
e) optionally a diluent.

The composition according to the invention may additionally contain polymeric binders. Examples of such binders are polyacrylates and Ripoxy polymers (Showa Highpolymer Co. Ltd.). The binders may be contained in an amount of 5 to 90, preferably 10 to 50, % by weight, based on the composition.

For the thermal crosslinking, a free radical initiator, for example organic azo compounds, such as azobisisobutyronitrile, or peroxides, such as diacylbenzoyl peroxide, is incorporated into the polyurethane. The amount may be 0.01 to 5% by weight, based on the composition.

A photopolymerization initiator is added to the composition according to the invention if the composition is crosslinked (cured), for example, by exposure to UV light. Typical examples of photopolymerization initiators are bezoin and benzoin alkyl ethers, such as benzoin, benzil, benzoin methyl ether, benzoin ethyl ether, benzoin n-propyl ether, benzoin n-butyl ether, benzoin isopropyl ether and the like; benzophenones, such as benzophenone, p-methylbenzophenone, Michler's ketone, methylbenzophenone, 4,4'-dichlorbenzophenone, 4,4-bisdiethylaminobenzophenone and the like; acetophenones, such as acetophenone, 2,2-dimethoxy-2-phenylacetophenone, 2,2-diethoxy-2-phenylacetophenone, 1,1-dichloroacetophenone, 1-hydroxycyclohexyl phenyl ketone, 2-methyl[4-methylthio)phenyl]-2-morpholino-1-propanone, N,N-dimethylaminoacetophenone and the like; thioxanthanone and xanthones, such as 2,4-dimethylthioxanthone, 2,4-diethylthioxanthone, 2-chlorothioxanthone, 2,4-diisopropylthioxanthone and the like; anthraquinones, such as anthraquinone, chloroanthraquinone, 2-methylanthraquinone, 2-ethylanthraquinone, 2-tert-butylanthraquinone, 1-chloroanthraquinone, 2-amylanthraquinone, 2-aminoanthraquinone and the like; ketals, such as acetophenone dimethyl ketal, benzyl dimethyl ketal and the like; benzoic esters, such as ethyl 4-dimethylaminobenzoate, 2-dimethylamino)ethyl benzoate, ethyl p-dimethylaminobenzoate and the like; and phenyl disulphides, 2-nitrofluorene, butyloin, anisoin ethyl ether, azobisisobutyronitriles, tetramethylthiuram disulphide and the like. These compounds may be contained individually or in combination in the composition according to the invention.

The photopolymerization initiator is preferably present in an amount of 0.1 to 15 and particularly preferably 1 to 10 percent by weight, based on the composition according to the invention.

Moreover, a photopolymerization accelerator in combination with the photopolymerization initiator can be added to the composition according to the invention. The photopolymerization accelerators accelerate the polymerization reaction. Typical examples are tertiary amines, such as triethylamine, triethanolamine, 2-dimethylaminoethanol and the like.

The composition according to the invention may contain a diluent, which is, for example, a photopolymerizable vinyl monomer and/or an organic solvent.

The photopolymerizable vinyl monomers are preferably selected from the group consisting of hydroxyalkyl acrylates, such as 2-hydroxyethyl acrylate, 2-hydroxybutyl acrylate and the like; mono- or diacrylates of glycols, such as, for example, ethylene glycol, methoxytetraethylene glycol, polyethylene glycol, propylene glycol and the like, ethylene glycol diacrylate, diethylene glycol diacrylate and the like; acrylamides, such as N,N-dimethylacrylamide, N-methylolacrylamide, methylenebisacrylamide, diethylenetriaminetriacrylamide, bisacrylamidopropoxyethane, bismethacrylamidoethyl methacrylate, N,-[(β-hydroxyethoxy)ethyl]acrylamide and the like, aminoalkyl acrylate, such as N,N-dimethylaminoethyl acrylate and the like; polyvalent acrylates of polyols, such as hexanediol, trimethylolpropane, pentaerythritol, dipentaerythritol, trihydroxyethyl isocyanurate and the like, and ethylene oxide adducts thereof or propylene oxide adducts; phenoxyacrylates, bisphenol A diacrylate, and acrylates of ethylene oxide adducts and propylene oxide adducts of these phenols; acrylates or glycidyl ethers, such as glyceryl diglycidyl ether, trimethylolpropane triglycidyl ether, triglycidyl isocyanurate and the like; melamine acrylate; and methacrylates of the abovementioned acrylates.

The organic solvents are preferably selected from the group consisting of the ketones, such as methyl ethyl ketone, cyclohexanone or methyl isobutyl ketone and the like; aromatic hydrocarbons, such as toluene, xylene, tetramethylbenzene and the like; glycol ethers, such as methylcellosolve, butylcellosolve, methylcarbitol, butylcarbitol, methoxypropanol, diethylether acetate, methoxypropyl acetate, propylene glycol monomethyl ether, dipropylene glycol monoethyl ether, triethylene glycol monoethyl ether and the like; esters, such as ethyl acetate, butyl acetate, acetates of the abovementioned glycol ethers and the like; alcohols, such as ethanol, propanol, ethylene glycol, propylene glycol and the like; aliphatic hydrocarbons, such as octane, decanes and the like; and petroleum-based solvents, such as petroleum ether, petroleum naphtha, hydrogenated petroleum naphtha, naphtha solvents and the like. These organic solvents serve for reducing the viscosity of the composition according to the invention, which leads to an improvement in their coating properties.

The diluent can be used alone or as a mixture of a plurality of diluents. The composition according to the invention may contain up to 95% by weight, preferably 10-50% by weight, of the diluent, based on the composition. The percentages by weight always sum to 100 percent by weight.

By adding the photopolymerizable vinyl monomer as a diluent to the composition according to the invention, not only is the viscosity reduced but at the same time the rate of polymerization is also increased. It is also possible to influence properties such as the developability and toughness.

Furthermore, crosslinking agents (epoxide, latent amine, cyanate) which are capable of reacting with the carboxyl groups may be added. Such crosslinking agents are known. Organic polyepoxide compounds having at least two epoxide groups in the molecule are preferred. Such polyepoxides are widely known. Glycidyl ethers of diols and polyols, for example bisphenol-A, bisphenol-S and bisphenol-F diglycidyl ether, and glycidyl ethers of phenol or cresol novolaks and cycloaliphatic epoxides are preferred. Diglycidyl esters of organic dicarboxylic acids are furthermore suitable. The glycidyl ethers can be preextended with diols or may be prepolymers. The amount of crosslinking agent may be, for example, 0.1 to 40% by weight, based on the polyurethane.

Examples of epoxy compounds and prepolymers are bisphenol S type epoxy resins, such as EBPS-200 (product of Nippon Kayaku), EPX-30 (product of ACR Co.), Epiclon EXA-1514 (product of Dainippon Ink Chemicals); diglycidyl phthalate resin, such as Plemmer DGT (product of Nippon Yushi); heterocyclic epoxy resins, such as TEPIC (product of Nissan Kagaku AG), Araldite PT810 (product of Ciba Geigy Inc.); bixylenol type epoxy resins, such as YX-4000 (product of Yuka Shell AG); biphenol type epoxy resins, such as YL-6056 (product of Yuka Shell); and tetraglycidylxylenoylethane resins, such as ZK-1063 (product of Tohto Kasei AG); novolak type epoxy resins, such as EPPN-201, EOCN-103, EOCN-1020, EOCN-1025 and BREN (products of Nippon Kayaku AG), ECN-278, ECN-292 and ECN-299 (products of Asahi Chemicals), ECN-1273 and ECN-1299 (products of Ciba Geigy Inc.), YDCN-220L, YDCN-220HH, YDCN-702, YDCN-704, YDPN-601 and YDPN-602 (products of Tohto Kasei AG), Epiclon-673, N-680, N-695, N-770 and N-775 (products of Dainippon Ink Chemicals AG); bisphenol A type novolak epoxy resins, such as EPX-8001, EPX-8002, EPPX-8060 and EPPX-8061 (products of Asahi Chemicals), Epiclon N-880 (product of Dainippon Ink Chemicals AG); chelate-type epoxy resins, such as EPX-49-60, EPX-49-30 (products of Asahi Denka Kogyo); glyoxal type epoxy resins, such as YDG-414 (products of Tohto Kasei AG); epoxy resins containing amine groups, such as YH-1402 and ST-110 (products of Tohto Kasei AG), YL-931 and YL-933 (products of Yuka Shell AG); rubber-modified epoxy resins, such as Epiclon TSR-601 (product of Dainippon Ink Chemicals), EPX-842, EPX-4061 (products of Ashai Denka); dicyclopentadiene-phenolic epoxy resins, such as DCE-400 (product of Yamawaki Kokusaku Pulp AG); silicone-modified epoxy resins, such as X-1359 (product of Asahi Denka Kogyo AG); and ε-caprolactone-modified epoxy resin, such as Plac G-402, G-710 (products of Daicel Chemicals); and epoxy resins partly esterified with (meth) acrylic acid.

Further examples of the prepolymers curable by the action of heat are Epikote® 180S70 (Yuka Shell Epoxy AG), Epiclon® N-670, Epiclon® N-673, Epiclon® N-680, Epiclon® N-690 and Epiclon® N-775 (Dainippon Ink Chemical AG), ECN-1273, ECN-1280 (Ciba Geigy AG).

The epoxides can also be cured with crosslinking, in a manner known per se, using poly-carboxylic acids or carboxylic anhydrides, if the photocrosslinkable polyurethanes according to the invention contain little or no carboxyl groups. For curing, it is also possible to use the polyurethanes according to the invention which contain carboxyl groups. The amount of polycarboxylic acids or polycarboxylic anhydrides may be, for example, 0.1-20% by weight, based on the composition.

The composition according to the invention may also contain an epoxide curing agent. This serves for crosslinking the epoxy groups during heating, so that the protective film produced using the composition according to the invention has good heat resistance, moisture resistance and electrical properties. Examples of said curing agents are s-triazine compounds, such as melamine, ethyldiamino-s-triazines, 2,4-diamino-s-triazine, 2,4-diamino-6-tolyl-s-triazine, 2,4-diamino-6-xylyl-s-triazine, and derivatives thereof. Guanidine compounds, such as guanidine, acetoguanidine, benzoguanidine, 3,9-bis[2-(3,5-diamino-2,4,6-triazaphenyl) ethyl]-2,4,8,10-tetraoxaspiro[5,5]undecane and the like, s-triazine compounds thereof are latent epoxide curing agents of the epoxy resins. They result in better adhesion between protective film and substrate. Consequently, corrosion and colour changes of the copper in the production of circuit boards can be prevented. Imidazole compounds likewise accelerate the adhesion. Moreover, polyamines, such as diaminodiphenylmethane, m-phenylenediamine, diaminodiphenyl sulphone, cyclohexylamine, m-xylylenediamine, 4,4'-diamino-3,3'-diethyldiphenylmethane, diethylenetriamine, tetraethylenepentamine, N-aminoethylpiperazine, isophoronediamine, dicyandiamide, urea, urea derivatives, polybasic hydrazines and the like, organic acid salts thereof and/or epoxy adducts thereof; tertiary amines, such as trimethylamine, triethanolamine, N,N-dimethyloctylamine, N,N-dimethylaniline, N-benzyldimethylamine, pyridine, N-methylpyridine, N-methylmorpholine, hexamethoxymethylmelamine, 2,4,6-tris(dimethylaminophenol), N-cyclohexyldimethylamine, tetramethylguanidine, m-aminophenol and the like; organic phosphines, such as tributylphosphine, triphenylphosphine, tris-2-cyanoethylphosphine and the like; potassium salts such as tri-n-butyl (2,5-dihydroxyphenyl)phosphonium bromide, hexadecyltributylphosphonium chloride and the like; quatemary ammonium salts, such as benzyltrimethylammonium chloride, phenyltrimethylammonium chloride, benzyltrimethylammonium bromide and the like; and photocationic polymerization catalysts, such as diphenyliodonium tetrafluoroborate, triphenylsulphonium hexafluoroantimonate, 2,4,6-triphenylthiopyrylium hexafluorophosphate, Irgacure 261 (product of Ciba Geigy) and the like, are also suitable. The abovementioned epoxide curing agents can be used alone or in combination.

The epoxide curing agents are expediently used in weight ratios of the polyepoxide to epoxide curing agent of 95:5 or less, preferably 98:2 or less. As a result of the presence of the epoxide curing agent in the abovementioned amount, sufficient crosslinking takes place so that desired water resistance and heat resistance are obtained, making the composition according to the invention particularly preferred compared with the compositions known to date.

The composition according to the invention can moreover contain inorganic and/or organic fillers in order to improve the adhesion properties or hardness of mouldings or layers. The inorganic fillers are preferably selected from the group consisting of barium sulphate, barium titanate, powdered silica, finely powdered silica, amorphous silica, talc, chalk, magnesium carbonate, calcium carbonate, alumina, aluminium hydroxide, mica powder and the like. The composition according to the invention preferably contains up to 60% by weight, preferably 5-40% by weight, of inorganic fillers.

Allyl compounds, such as diallyl phthalate prepolymer, diallyl isophthalate prepolymer and the like, can be added as organic fillers. By adding the organic fillers, it is also possible to increase the chemical stability. The composition according to the invention may contain up to 30% by weight and particularly preferably up to 20% by weight of organic fillers per 100% by weight of the prepolymer curable by exposure to light. Examples are Daiso Dap and Daiso Isodap, produced by Osaka Soda AG and having an average molecular weight of 2 000-30 000 g/mol, and diallyl isophthalate prepolymers having an average molecular weight of 5 000-20 000 g/mol.

The composition according to the invention may also contain additives, such as dyes, pigments, lubricants, mould release agents, thickeners, antifoams, levelling agents, thermal polymerization inhibitors or antioxidants. Possible dyes are phthalocyanine blue, phthalocyanine green, iodine green, disazo yellow, crystal violet, titanium oxide, carbon black, naphthalene black and the like. Possible thermal polymerization inhibitors are hydroquinone, hydroquinone monomethyl ether, tert-butylcatechol, pyrogallol, phenothiazine and the like. Suitable thickeners are, for example, orben, penton, montmorillonite and the like. Suitable antifoams are, for example, fluorosilicone-like, fluoride-like or polymer-like antifoams.

The crosslinkable polyurethanes can be employed, for example, as thermosetting moulding materials with the use of customary shaping methods. Depending on the thickness of the mouldings, the crosslinking can be effected thermally and/or by means of radiation and curing can thus be achieved. Additives by means of which the processing and properties can be influenced may be added to the moulding materials. Customary additives are, for example, lubricants, mould release agents, plasticizers, fillers, reinforcing fillers, pigments and dyes. Industrial components and utility articles which are distinguished by good mechanical resistance can be produced from the thermosetting moulding materials.

The crosslinkable polyurethanes can also be used as adhesive for permanently bonding different materials, such as, for example, metals, wood, plastics, ceramic, glass, quartz glass, cardboard and paper. Transparent and translucent materials can be adhesively bonded only by means of irradiation, thermally or by both means. Opaque materials are expediently adhesively bonded under the action of heat. Adhesively bonded materials have excellent adhesive strength and peel resistance. The adhesives are therefore suitable for the production of composite materials. Solutions, dispersions or powders may be used for adhesive bonding, and the adhesive bond may additionally be produced under pressure.

The crosslinkable polyurethanes can also be used for the coating of surfaces either for decorative purposes or for protective purposes. For decorative purposes, the coated surfaces can also be photostructured under a mask, and the irradiated parts can be additionally thermally postcured after the development with, for example, organic solvents or aqueous alkalis and drying. The layer thicknesses may be in the range from 1 μm to 1 mm. The moulding materials for coating may contain additives, such as fillers, dyes, pigments, adhesion promoters and surfactants. The coating can be carried out using solutions, dispersions or powders, with the use of known coating methods, such as, for example, brushing, knife coating, casting, spraying, curtain coating, electrostatic spray methods, inkjet, dip coating and screen printing. For example, printing plates or printing rolls can also be produced in this manner.

A field of use which is preferred for the composition according to the invention is the use as an etch resist, solder masks or liquid dielectric in the production of circuit boards. Use also comprises gap filling for the production of planar surfaces and the filling of cavities, such as, for example, drilled holes. In the production of a circuit board having a structured layer, the printed circuit board is, for example, first coated with the composition according to the invention and then dried for evaporation of a diluent with formation of a film (60 to 95° C. for 15 to 60 minutes). The film is then preferably exposed imagewise with the use of a patterned negative mask. The exposure can also be carried out directly without a mask by laser inscription methods. After the exposure, the film is developed in order to remove the unexposed parts of the film. Finally, the film can be postcured by heating, a solder resist pattern serving as a protective film being obtained on the circuit board. The heat treatment for postcuring can be carried out at 100 to 200° C., preferably 120 to 150° C.

Particularly suitable radiation sources are UV sources, for example high-pressure mercury lamps and xenon lamps or lasers, including UV lasers.

The choice of the developer liquid depends substantially on the acidity of the crosslinkable polyurethane. At a high acidity, aqueous-alkaline developers are advantageously used. Examples of aqueous alkaline solutions are aqueous solutions comprising potassium hydroxide, sodium hydroxide, sodium carbonate, potassium carbonate, sodium phosphate, sodium silicate, ammonia, amines and the like and/or aqueous solutions comprising a surfactant. At low acidity, organic developer liquids, for example cyclohexanone, xylene, tetramethylbenzene, butylcellosolve, butylcarbitol, propylene glycol monomethyl ether, diethylene glycol monoethyl ether, cellosolve acetate, propanol, propylene glycol, trichloroethane, trichloroethylene, γ-aminobutyrolactone, modified trichloroethane [Eterna IR (product of Asahi Kasei Kogyo), Squone EX-R (product of Toa Gosei Kagaku), Kanden Triethan SR-A (product of Kanto Denka Kogyo), Resisolve V-5 (product of Asahi Glass)], are expediently used.

The composition according to the invention is preferably sold in a set comprising two containers A and B. Those components which react together can thus be separated so that the container A contains the crosslinking agents (polyepoxide compounds) curable by the action of heat and the container B contains the other ingredients of the composition, or the container A contains a polycarboxylic acid or a carboxylic anhydride if the polyurethane has no carboxyl groups or only a few carboxyl groups.

Mouldings or coatings of the composition according to the invention have outstanding physical, mechanical and electrical properties, for example hardness, thermal shock resistance and electrical resistance measured under humid conditions and flexural strength.

Optionally photostructured coatings of the composition according to the invention are distinguished by their adhesive strength, elongation at break, hardness and resistance to treatment baths. Furthermore, high photoreactivity and hence short exposure times during exposure to, preferably, UV light, coupled with high resolution, are achieved.

The invention also relates to mouldings of the cured composition according to the invention.

The invention furthermore relates to materials in which at least one surface is coated with a cured, optionally photostructured composition according to the invention.

The invention also relates to a process for the production of solder masks on a printed circuit, comprising the steps a) coating of a circuit board with the photocrosslinkable composition according to the invention, b) drying of the layer on the substrate, c) imagewise exposure of the dried layer under a negative photomask or by means of laser inscription,
d) treatment of the exposed layer with a developer for removing the unexposed parts, and
e) optionally thermal curing of the developed layer.

The examples which follow explain the invention in more detail.

ABBREVIATIONS

ACA 250 Polyacrylate resin, Daicel Chemical Industries, LTD
MPA=PMA Methoxypropylacetate
MP Methoxypropanol
Cr—Hex—CEM Chromium(III) 2-ethylhexanoate
TMPTA Trimethylolpropane triacrylate (Cray Valley)
Ebecryl 160 Poly[oxy-1,2-ethanediyl-alpha,hydro-omega-[(1-oxo-2-propenyl)oxyl]]ether and 2-ethyl-2-(hydroxymethyl)-1,3-propanediol (3:1), (UCB)
Irgacure 907 2-Methyl-1-(4-methylthio)phenyl-2-morpholino-1-propanone (Ciba)
Orasol blue GN Phthalocyanine dye, Ciba
Quantacure ITX 2,4-Isopropylthioxanthone, Rahn
Silbond FW 600AST $SiO_2$, Quartzwerk Frechen
Dyhard UR 200 Substituted aromatic urea (Rahn)
Tego 900 Polysiloxane (Tego)
Syloid 161 Amorphous silica, $SiO_2$ (Grace)
DER 331 Bisphenol-A epoxy resin (Dow)
Lionol Green 2Y-301 Phthalocyanine dye (Toyo)
Scripset Styrene/maleic anhydride copolymer, Monsanto

A) PREPARATION EXAMPLES FOR POLYURETHANES CONTAINING CARBOXYL GROUPS

Example A1

Preparation of a Dimethylolpropionic Acid-containing Polyurethane 38.70 parts by weight of dimethylolpropionic acid (DMPA), 4.84 parts by weight of polyethylene glycol 300 (POE300), 4.84 parts by weight of bis(hydroxymethyl)tricyclo[5.2.1.0(2.6)]decane and 260.35 g of the solvent methoxypropyl acetate (MPA) are introduced into a reactor and suspended by stirring. 1 percent by weight, based on the weight of the diols, of the catalyst dibutyltin dilaurate (DBTL), is then added. The reactor is placed under an inert atmosphere by evacuation and flushing with nitrogen. The mixture initially introduced into the reactor is heated to 80° C., and 51.5 parts by weight of toluene diisocyanate (TDI) are added dropwise over a period of 2 hours to the initially introduced mixture in the reactor under a slightly excess nitrogen pressure. After the end of the addition of TDI, the reaction solution is allowed to react at 80° C. until the concentration of the diisocyanate has decreased to less than 0.02 mol/kg. The concentration of the diisocyanate in a sample taken is determined indirectly after addition of an excess of butylamine by titration with HCl. Once the concentration of the diisocyanate has decreased to 0.02 mol/kg, 84.85 g of dipropylene glycol methyl ether are added and the reaction is allowed to continue for a further hour at 80° C. The polymer solution thus obtained is characterized by acid titration (1.29 mol/kg), GPC (Mw: 10 000 g/mol; D: 2.6) and solids analysis (44.98%).

B) POLYURETHANES HAVING UNSATURATED SIDE CHAINS AND FREE CARBOXYL GROUPS

Example B1

Reaction Product with Glycidyl Methacrylate 22.29 parts by weight of dimethylolpropionic acid (DMPA), 8.07 parts by weight of 1,4-butanediol, 8.07 parts by weight of polyethylene glycol 300 (POE300) and 273.13 g of the solvent methoxypropyl acetate (MPA) are introduced into a reactor and suspended with stirring. 1 percent by weight, based on the weight of the diols, of the catalyst dibutyltin dilaurate (DBTL) is then added. The reactor is placed under an inert atmosphere by evacuation and flushing with nitrogen. The mixture initially introduced into the reactor is heated to 80° C., and 61.57 parts by weight of isophorone diisocyanate (IPDI) are added dropwise over a period of 2 hours to the initially introduced mixture in the reactor under a slightly excess nitrogen pressure. After the end of the addition of IPDI, the reaction solution is allowed to continue reacting at 80° C. until the concentration of the diisocyanate has decreased to less than 0.02 mol/kg. The concentration of the diisocyanate in a sample taken is determined indirectly after the addition of an excess of butylamine by titration with HCl. Once the concentration of the diisocyanate has decreased to 0.02 mol/kg, 88.73 g of dipropylene glycol methyl ether are added and the reaction is allowed to continue for a further hour at 80° C.

Thereafter, the temperature is increased to 95° C. and air is introduced under the reaction surface. After the addition of 0.2 percent by weight of di-tert-butyl-p-cresol and 0.2 percent by weight of Cr—Hex—CEM, 6.1 parts by weight of glycidyl methacrylate are added dropwise over a period of 40 minutes. After the end of the addition, the reaction solution is allowed to react for a further 10 hours at 90° C. The polymer solution thus obtained is characterized by acid titration (0.51 mol/kg), epoxide titration (0.02 mol/kg), GPC (Mw: 15 700 g/mol; D: 3.18) and solids analysis (48%).

Example B2

Reaction Product with Glycidyl Methacrylate 35.51 parts by weight of dimethylolpropionic acid (DMPA), 3.95 parts by weight of polyethylene glycol 300 (POE300) and 212.81 g of the solvent methoxypropyl acetate (MPA) are introduced into a reactor and suspended with stirring. 1 percent by weight, based on the weight of the diols, of the catalyst dibutyltin dilaurate (DBTL) is then added. The reactor is placed under an inert atmosphere by evacuation and flushing with nitrogen. The mixture initially introduced into the reactor is heated to 80° C., and 60.54 parts by weight of isophorone diisocyanate (IPDI) are added dropwise over a period of 2 hours to the initially introduced mixture in the reactor under slightly excess nitrogen pressure. After the end of the addition of IPDI, the reaction solution is allowed to continue reacting at 80° C. until the concentration of the diisocyanate has decreased to less than 0.02 mol/kg. The concentration of the diisocyanate in a sample taken is determined indirectly after the addition of an excess of butylamine by titration with HCl. Once the concentration of the diisocyanate has decreased to 0.02 mol/kg, 88.73 g of dipropylene glycol methyl ether are added and the reaction is allowed to continue for a further hour at 80° C. Thereafter, the temperature is increased to 95° C. and air is introduced under the reaction surface. After the addition of 0.2% by weight of di-tert-butyl-p-cresol and 0.2% by weight of Cr—Hex—CEM, 17.5 parts by weight of glycidyl methacrylate are added dropwise over a period of 40 minutes. After the end of the addition, the reaction solution is allowed to continue reacting for a further 10 hours at 90° C. The polymer solution thus obtained is characterized by acid titration (0.42 mol/kg), epoxide titration (0.04 mol/kg), GPC (Mw: 25 000 g/mol; D: 5.19) and solids analysis (49%).

Example B3

Preparation of a Block Copolymer

Polymer Solution I:
28.9 parts by weight of dimethylolpropionic acid (DMPA), 7.2 parts by weight of polyethylene glycol 300 (POE300) and 116.25 g of the solvent methoxypropyl acetate (MPA) are introduced into a reactor and suspended with stirring. 1 percent by weight, based on the weight of the diols, of the catalyst dibutyltin dilaurate (DBTL) is then added. The reactor is placed under an inert atmosphere by evacuation and flushing with nitrogen. The mixture initially introduced into the reactor is heated to 80° C., and 63.9 parts by weight of isophorone diisocyanate (IPDI) are added dropwise over a period of 2 hours to the initially introduced mixture in the reactor under slightly excess nitrogen pressure. After the end of the addition of IPDI, the reaction solution is allowed to continue reacting at 80° C. until the concentration of the diisocyanate has decreased to less than 0.02 mol/kg. The concentration of the diisocyanate in a sample taken is determined indirectly after the addition of an excess of butylamine by titration with HCl. The polymer solution thus obtained is characterized by acid titration (1.26 mol/kg), GPC (Mw: 11 900 g/mol; D: 3.2) and solids analysis (58.6%).

Polymer Solution II:
33.6 parts by weight of 1,4-butanediol and 124.84 g of the solvent methoxypropyl acetate (MPA) are introduced into a reactor and mixed by stirring. One percent by weight based on the weight of the diols, of the catalyst dibutyltin dilaurate (DBTL) is then added. The reactor is placed under an inert atmosphere by evacuation and flushing with nitrogen. The mixture initially introduced into the reactor is heated to 80° C., and 66.4 parts by weight of isophorone diisocyanate (IPDI) are added dropwise over a period of 2 hours to the initially introduced mixture in the reactor under slightly excess nitrogen pressure. After the end of the addition of IPDI, the reaction solution is allowed to continue reacting at 80° C. until the concentration of the diisocyanate has decreased to less than 0.02 mol/kg. The concentration of the diisocyanate in a sample taken is determined indirectly after the addition of an excess of butylamine by titration with HCl. The polymer solution thus obtained is characterized by means of GPC (Mw: 3 300 g/mol; D: 1.9) and solids analysis (53.1%).

Block Copolymer
198.4 g of polymer solution I are reacted in a reactor with 107 g of polymer solution II and 1 percent by weight, based on the weight of the diols, of the catalyst dibutyltin dilaurate (DBTL) with stirring under an inert atmosphere for 15 hours at 80° C. The concentration of the diisocyanate in a sample taken is determined indirectly after the addition of an excess of butylamine by titration with HCl. After the concentration of isocyanate groups has decreased to less than 5% of the starting value, 51.52 g of DPM are added and the reaction is continued for a further hour at 80° C. The polymer solution thus obtained is characterized by acid titration (0.65 mol/kg), GPC (Mw: 36 700 g/mol; D: 6.6) and solids analysis (47.9%).

Reaction with Glycidyl Methacrylate:
Thereafter, the temperature is increased to 95° C. and air is introduced below the reaction surface. After the addition of 0.2% by weight of di-tert-butyl-p-cresol and 0.2 percent by weight of Cr—Hex—CEM, 5.6 parts by weight of glycidyl methacrylate are added dropwise over a period of 40 minutes. After the end of the addition, the reaction solution is allowed to continue reacting for a further 10 hours at 90° C. The polymer solution thus obtained is characterized by acid titration (0.45 mol/kg), epoxide titration (0.03 mol/kg), GPC (Mw: 36 000 g/mol; D: 6.6) and solids analysis (51.5%).

Example B4

Preparation of a Polyurethane with Hydroxylated Polybutadiene 34.67 parts by weight of dimethylolpropionic acid (DMPA), 8.67 parts by weight of hydroxylated polybutadiene (Krasol 5000) and 193.76 g of the solvent diethylene glycol diether acetate (DEA) are introduced into a reactor and suspended by stirring. 0.4 percent by weight, based on the number of moles of the diol groups, of the catalyst dibutyltin dilaurate (DBTL) is then added. The reactor is placed under an inert atmosphere by evacuation and flushing with nitrogen. The mixture initially introduced into the reactor is heated to 80° C., and 56.66 parts by weight of isophorone diisocyanate (IPDI) are added dropwise over a period of 2 hours to the initially introduced mixture in the reactor under slightly excess nitrogen pressure. After the end of the addition of IPDI, the reaction solution is allowed to continue reacting at 80° C. until the concentration of the diisocyanate has decreased to less than 0.04 mol/kg. The concentration of the diisocyanate in a sample taken is determined indirectly after the addition of an excess of butylamine by titration with HCl. Once the concentration of the diisocyanate has decreased to 0.02 mol/kg, 103.87 g of dipropylene glycol methyl ether are added and the reaction is allowed to continue for a further hour at 80° C.

Thereafter, the temperature is increased to 95° C. and air is passed in below the reaction surface. After the addition of 0.2 percent by weight of di-tert-butyl-p-cresol and 0.2 percent by weight of Cr—Hex—CEM, 17.37 parts by weight of glycidyl methacrylate are added dropwise over a period of 40 minutes. After the end of the addition, the reaction solution is allowed to continue reacting for a further 10 hours at 90° C. The polymer solution thus obtained is characterized by acid titration (0.41 mol/kg), epoxide titration (0.05 mol/kg), GPC (Mw: 55 350 g/mol; D: 11.5) and solids analysis (43.84%).

C) USE EXAMPLES

Example C1

Solder Masks

Those constituents of the two components which are mentioned in the table below are mixed and are milled by means of a three-roll mill to give a homogeneous material. The process is repeated three times so that the particle size of the largest, solid constituents of the prepared formulation is not greater than 3 μm. Resin component and curing agent component are mixed immediately before the application in the stated ratio.

TABLE

Formulations for solder mask application

|  | Formulation C1a (parts by wt.) | Formulation C1b (parts by wt.) | Formulation C1c (parts by wt.) | Formulation C1d (parts by wt.) | Formulation C1e (parts by wt.) (comparison) |
|---|---|---|---|---|---|
| Resin |  |  |  |  |  |
| Resin B1 |  | 50.00 |  |  |  |
| Resin B2 |  |  | 50.00 |  |  |
| Resin B3 | 50.00 |  |  |  |  |
| Resin B4 |  |  |  | 50.00 |  |
| Resin ACA250 |  |  |  |  | 50.00 |
| MPA | 3.40 | 3.40 | 3.40 | 3.40 | 3.40 |
| Irgacure 907 | 3.35 | 3.35 | 3.35 | 3.35 | 3.35 |
| Quantacure ITX | 1.20 | 1.20 | 1.20 | 1.20 | 1.20 |
| Silbond FW 600AST | 21.80 | 21.80 | 21.80 | 21.80 | 21.80 |
| Benzotriazole | 0.03 | 0.03 | 0.03 | 0.03 | 0.03 |
| Dicyandiamide | 0.03 | 0.03 | 0.03 | 0.03 | 0.03 |
| Dyhard UR 200 | 0.25 | 0.25 | 0.25 | 0.25 | 0.25 |
| Tego 900 | 0.09 | 0.09 | 0.09 | 0.09 | 0.09 |
| Syloid 161 | 3.85 | 3.85 | 3.85 | 3.85 | 3.85 |
| Resin component (total) | 83.97 | 83.97 | 83.97 | 83.97 | 83.97 |
| Curing agent |  |  |  |  |  |
| Ebecryl 180 | 7.10 | 7.10 | 7.10 | 7.10 | 7.10 |
| PMA | 3.20 | 3.20 | 3.20 | 3.20 | 3.20 |
| Hydroquinone | 0.002 | 0.002 | 0.002 | 0.002 | 0.002 |
| DER 331 | 5.37 | 5.37 | 5.37 | 5.37 | 5.37 |
| Lionol Green 2Y-301 | 0.36 | 0.36 | 0.36 | 0.36 | 0.36 |
| Resin component (total) | 16.03 | 16.03 | 16.03 | 16.03 | 16.03 |

The formulation is applied by means of a screen printing application to the surface of a copper-coated plate and dried in a convection oven at 80° C. for 50 minutes. The coated surface is exposed to UV light (365 nm, 400 mJ/cm$^2$) through a photomask. Unexposed parts of the coating are removed from the plate using 1% strength aqueous $Na_2CO_3$ solution at a spray pressure of 2 kg/cm$^2$ for 60 seconds. The coating is then heat-cured (150° C., 60 minutes).

The following tests are carried out in a solder mask application.

A. Tack-Free Coat Surface After Drying

The surface coating is rated as tack-free (tf) if the photomask shows no adhesive surface after exposure to light.

B. Hardness After Drying

The formulation is applied to a copper-coated plate and predried for 5 minutes at room temperature. Thereafter, the plate is dried for 50 minutes in a convection oven at 80° C. and cooled to room temperature. The hardness of the coat is measured by determining the pencil hardness. The stated pencil hardness is based on the hardness of a pencil which, when it is moved along the surface at an angle of 45° under slight, constant pressure, produces no visible damage to the surface. The hardness of the pencils used is 6B, 5B, 4B, 3B, 2B, B, HB, H, 2H, 3H, 6B relating to the softest and 3H to the hardest pencil.

C. Photoreactivity of the Coat

Coated and dried plates are exposed to UV light (365 nm, 400 mJ/cm$^2$) through a mask and are then developed. The photoreactivity of the coat is determined using a Stouffer sensitivity scale 21 (SSG21).

D. Adhesion of the Coat to the Copper Surface

Coated and dried plates are exposed to UV light (365 nm, 400 mJ/cm$^2$) through a mask. After the development, the coated surface is heat-cured for 60 minutes at 150° C. The adhesion of the cured coat to the copper surface is determined by carrying out a crosshatch test. For this purpose, the coated surface is first scored in a defined pattern, and an adhesive tape (Scotch Brand 9898) is then pressed onto the resulting pattern and removed again (adhesive tape test). The quality of the adhesion is rated as:

oo no breaking off of the edges of the coat at the corners of the scored pattern o slight damage to the edges of the coat at the corners of the scored pattern x severe damage to the edges of the coat at the corners of the scored pattern xx the coat is completely removed at the corners of the scored pattern E. Solvent Resistance Coated, dried, exposed, developed and heat-cured plates are incubated at room temperature for 10 minutes in $CH_2Cl_2$. The state of the coat after the incubation is rated as follows by means of measurement of the pencil hardness:

oo pencil hardness of the coated surface corresponds to that measured before the incubation
o slight deviation of the pencil hardness after the incubation
x considerable deviation of the pencil hardness after the incubation
xx formation of blisters, swelling and delamination of the coating from the surface F. Resistance to Chemical Ni—Au Surface Coating A chemical Ni—Au surface coating of processed plates is carried out by standardized methods (Shipley, Atotech). Decreases in the adhesion of the solder mask to the copper surface are determined by carrying out an adhesive tape test (cf. D) and are rated as follows:
oo no decreases in adhesion
o slight decreases in adhesion
x considerable decreases in adhesion
xx total loss of adhesion G. Stability to Solder Process Coated, dried, exposed, developed and heat-cured plates are first immersed in flux (25% rosin in isopropanol). The plates are then dried for 60 seconds and immersed three times for 10 seconds each time in a solder bath (288° C.). Thereafter, the state of the coat is rated as follows:

oo no change in the coated surface
o slight change in the coated surface
x considerable change, cracks in the coated surface
xx blister formation, swelling and delamination of the coated surface H. Resolution Coated and dried plates are exposed to UV light (365 nm, 400 mJ/cm$^2$) through a mask and are then developed. The resolution is determined using a Stouffer resolution scale (SRG).

I. Pressure Cooker Test

Coated and dried plates are exposed to UV light (365 nm, 400 mJ/cm$^2$) through a mask, developed, cured for 1 hour at 150° C. and then incubated for 72 hours in a pressure cooker at 120° C. and 1.5 bar. The state of the coated surface is then rated as follows:
oo no change in the coated surface
o slight change in the coated surface
x considerable change in the coated surface
xx blister formation, swelling and delamination of the coated surface J. Stripping Coated and dried plates are exposed to UV light (365 nm, 400 mJ/cm$^2$) through a mask, developed, cured for 1 hour at 150° C. and then incubated in a 50% strength aqueous KOH solution at 90° C. After defined time intervals, the plates are removed from the solution and, if necessary, brushed with a brush using 20 strokes of the brush. Plates are rated as stripped if the solder mask has been completely removed both from the laminate and from the copper tracks.

K. Erichsen Bending Test

The bending strength of the coats was determined by means of an Erichsen 202C according to DIN 53156.

L. Storage Under Thermal Shock Conditions:

Coated and dried plates are exposed to UV light (365 nm, 400 mJ/cm$^2$) through a mask, developed, cured for 1 hour at 150° C. and then subjected to storage under thermal shock conditions for 100 cycles (−65° C., 15 minutes (min)/+125° C., 15 min or −55° C., 30 min/+125° C., 30 min).

TABLE

Results with formulations of example C1

| Test | Formulation C1a | Formulation C1b | Formulation C1c | Formulation C1d | Formulation C1e (Comparison) |
|---|---|---|---|---|---|
| Tack-free surface | tf | tf | tf | tf | tf |
| Photosensitivity SSG (400 mJ/cm$^2$) | 11 | 13 | 11 | 14 | 12 |
| Adhesion to copper | oo | oo | oo | oo | o |
| Solvent resistance | oo | oo | oo | oo | oo |
| Ni—Au resistance | oo | oo | oo | oo | o |
| Stability to solder process | oo | o | oo | oo | x |
| Resolution (SRG, mill) | 1.5 | 1.2 | 1.0 | 1.0 | 1.7 |
| Pressure cooker test | o | oo | o | not determined | x |
| Erichson (mm) | 1.4 | 1.0 | 1.0 | 1.8 | 0.35 |
| Stripping (min) | 15 | 45 | 15 | 15 | >60 |
| Pencil hardness after drying | B | 2B-3B | B | B-2B | 4B |
| Storage under thermal shock conditions | 0 > 100 | 100 > 200 | 0 > 100 | 250 > 500 | 0 > 100 |

Example C2

Liquid Etch Resist

The constituents mentioned in the table are mixed and are processed using a Dispermat (200 rpm, 60° C., 30 min) to give a homogeneous solution and filtered (pore size of the filter: 2).

TABLE

Formulations for a liquid etch resist

| | Formulation C2a | Formulation C2b (Comparison) |
|---|---|---|
| Resin B2 | 74.66 | |
| Scripset resin | | 74.66 |
| Ebecryl 220 | 2.96 | 2.96 |
| Ebecryl 350 | 0.23 | 0.23 |

TABLE-continued

Formulations for a liquid etch resist

| | Formulation C2a | Formulation C2b (Comparison) |
|---|---|---|
| Irgacure 907 | 2.52 | 2.52 |
| Rheomet 4 | 0.23 | 0.23 |
| SR454 | 6.76 | 6.76 |
| Mitsui UV blue 236 | 0.05 | 0.05 |
| BYK 330 | 0.05 | 0.05 |
| 2,4-Isopropyl-thioxanthone | 1.26 | 1.26 |
| 2,6-Di-tert-butyl-p-cresol | 0.02 | 0.02 |
| Total | 100 | 100 |

The formulation is applied to a copper-coated glass fibre-reinforced epoxy laminate by means of a horizontal roller coater. The coated plates are dried in a convection oven at 80° C. for 3 minutes and then exposed through a mask through UV light (365 nm, 120 mJ/cm$^2$). The layer thickness (9-11 μm) of the coat is measured using an isoscope (Fischer).

Uncrosslinked parts of the coat are removed with 1% aqueous $Na_2CO_3$ solution at a spray pressure of 2.0 kg/cm$^2$ for 60 seconds. Uncoated copper of the plates is removed using etch solution (2-3 N aqueous HCl, 80-140 g copper/l) at a spray pressure of 2 bar.

The following tests are carried out in order to determine the properties of the formulations in a liquid etch resist application. All tests are carried out in comparison with a reference formulation as an internal standard.

1. Hardness After Drying

The formulation is applied to a copper-coated plate and predried for 5 minutes at room temperature. Thereafter, the plate is dried for 3 minutes in a convection oven at 80° C. and cooled to room temperature. The hardness of the coat is measured by determining the pencil hardness. The stated pencil hardness relates to the hardness of a pencil which, if it is moved along the surface at an angle of 45° under slight, constant pressure, produces no visible damage to the surface. The hardness of the pencils used is 6B, 5B, 4B, 3B, 2B, B, HB, H, 2H, 3H, 6B relating to the softest and 3H to the hardest pencil.

2. Hardness in the Developer

After exposure to UV light, the coated copper plate is placed in a developer solution for one minute at 30° C. The plate is removed from this bath, and the pencil hardness of the wet surface is determined as described under point 1.

3. Photoreactivity of the Coat

Coated and dried plates are exposed to UV light (365 nm, 120 mJ/cm$^2$) through a mask. The photoreactivity of the coat is determined using a Stouffer sensitivity scale 21 (SSG21).

4. Resolution

Coated and dried plates are exposed to UV light (365 nm, 120 mJ/cm$^2$) through a mask. The resolution is determined using a Stouffer resolution scale (SRG).

5. Development

A coated and dried plate is introduced into a gently agitated bath containing developer solution (1% strength aqueous $Na_2CO_3$) at a temperature of 30° C., and the time required for the coat to start becoming detached from the plate is measured.

6. Strippability

A coated, dried and exposed plate is introduced into a vigorously agitated bath containing stripping solution (4% strength aqueous NaOH) at a temperature of 45° C., and the time required for the coat to start to become detached from the plate is measured.

7. Etching

The quality of the copper tracks after the etching is assessed both by optical microscopy and by electron microscopy.

Assessment criteria:
oo straight lines of constant copper thickness
o straight lines with slight deviations in the copper thickness
x wavy lines of constant copper thickness
xx wavy lines with slight deviations in the copper thickness

TABLE

Results of example C2

| Test | Formulation C2a | Formulation C2b (Comparison) |
|---|---|---|
| Pencil hardness in developer | B | >5B |
| Photosensitivity (SSG) | 9 | 5 |
| Resolution SRG (mill) | <0.5 | <0.5 |
| Development rate (sect) | 60 | 60 |
| Strippability (sec) | 60 | 60 |
| Etching | oo | o |

The invention claimed is:

1. A process for producing a solder mask on a printed circuit board, comprising the steps:
   a) coating of a circuit board with a layer of a photo-crosslinkable composition comprising:
      A1) a linear, crosslinkable polyurethane obtained from monomers comprising
         i) at least one diisocyanate having 2 to 30 carbon atoms;
         ii) at least one aliphatic or cycloaliphatic diol having 2 to 30 carbon atoms, to whose carbon chain one or more carboxyl groups have been covalently bonded, and some or all of the carboxyl groups have been esterified with an olefinically unsaturated $C_3$-$C_8$ alcohol or with a glycidyl ester of an olefinically unsaturated $C_3$-$C_8$ carboxylic acid; and
         (iii) radicals of at least one aliphatic, cycloaliphatic or cycloaliphatic-aliphatic diol, or at least one oligomeric or polymeric oxaalkylene glycol, one polyesterdiol, polycarbonatediol or polylactonediol, or of a diol based on polybutadiene or polyisoprene;
      A2) an initiator for thermally crosslinking olefinic groups and/or a photoinitiator; and
      A3) optionally a diluent;
   b) drying of the layer on the circuit board;
   c) imagewise exposure of the layer under a negative photomask or by laser inscription;
   d) treatment of the layer with a developer for removing unexposed parts to produce the solder mask; and
   e) optionally heat-curing of the solder mask.

2. A process according to claim 1, wherein the photo-crosslinkable composition additionally contains:
   A4) a polymeric binder.

3. A process according to claim 1, wherein the photo crosslinkable composition additionally contains:
   A5) one or more crosslinking agents which are capable of reacting with the carboxyl group.

4. A process according to claim 3, wherein the crosslinking agent is a polyepoxide having at least 2 epoxide groups.

5. A process according to claim 4, wherein the photocrosslinkable composition additionally contains a polycarboxylic acid or carboxylic anhydride for thermally crosslinking the polyepoxide.

6. A linear, crosslinkable polyurethane obtained from monomers comprising:
 a) at least one diisocyanate having 2 to 30 carbon atoms;
 b) at least one aliphatic or cycloaliphatic diol having 2 to 30 carbon atoms, to whose carbon chain one or more carboxyl groups have been covalently bonded, and some or all of the carboxyl groups have been esterified with an olefinically unsaturated $C_3$-$C_8$ alcohol or with a glycidyl ester of an olefinically unsaturated $C_3$-$C_8$ carboxylic acid; and
 (c) radicals of at least one aliphatic, cycloaliphatic or cycloaliphatic-aliphatic diol, or at least one oligomeric or polymeric oxaalkylene glycol, one polyesterdiol, polycarbonatediol or polylactonediol, or of a diol based on polybutadiene or polyisoprene.

7. A linear, crosslinkable polyurethane according to claim 6, which is obtained from using as monomer
 at least one aliphatic, cycloaliphatic or cycloaliphatic-aliphatic diol, or at least one oligomeric or polymeric oxaalkylene glycol.

8. A composition comprising:
 a) a crosslinkable polyurethane according to claim 6;
 b) an initiator for the thermal crosslinking of the olefinic groups and/or a photoinitiator, or
 c) optionally a diluent.

9. A composition according to claim 8, which additionally contains:
 d) a polymeric binder.

10. A composition according to claim 8, which additionally contains crosslinking agents which are capable of reacting with a carboxyl group.

11. A composition according to claim 10, wherein the crosslinking agent is a polyepoxide having at least 2 epoxide groups.

12. A composition according to claim 11, which additionally contains a polycarboxylic acid or carboxylic anhydride for thermally crosslinking the polyepoxides.

13. A moulding produced by curing a composition comprising:
 a) a crosslinkable polyurethane obtained from monomers comprising:
  i) at least one diisocyanate having 2 to 30 carbon atoms;
  ii) at least one aliphatic or cycloaliphatic diol having 2 to 30 carbon atoms, to whose carbon chain at least one carboxyl group is covalently bonded, and some or all of said carboxyl groups have been esterified with an olefinically unsaturated $C_3$-$C_8$ alcohol or with a glycidyl ester of an olefinically unsaturated $C_3$-$C_8$ carboxylic acid;
  iii) radicals of at least one aliphatic, cycloaliphatic or cycloaliphatic-aliphatic diol, or at least one oligomeric or polymeric oxaalkylene glycol, or a polyesterdiol, or a polycarbonatediol or a polylactonediol or a diol based on polybutadiene or polyisoprene; and
  iv) optionally at least one aliphatic or cycloaliphatic diol having 2 to 30 carbon atoms, to whose carbon chain at least one carboxyl group is covalently bonded;
 b) an initiator for the thermal crosslinking of the olefinic groups and/or a photoinitiator; and
 c) optionally a diluent.

* * * * *